(12) United States Patent
Muchherla et al.

(10) Patent No.: US 12,423,002 B2
(45) Date of Patent: Sep. 23, 2025

(54) SELECTIVELY PROGRAMMING RETIRED WORDLINES OF A MEMORY DEVICE

(71) Applicant: MICRON TECHNOLOGY, INC., Boise, ID (US)

(72) Inventors: Kishore Kumar Muchherla, San Jose, CA (US); Akira Goda, Tokyo (JP); Jeffrey S. McNeil, Nampa, ID (US); Niccolo' Righetti, Boise, ID (US); Silvia Beltrami, Almenno San Bartolomeo (IT); Violante Moschiano, Avezzano (IT); Ugo Russo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 18/090,449

(22) Filed: Dec. 28, 2022

(65) Prior Publication Data
US 2023/0214133 A1    Jul. 6, 2023

Related U.S. Application Data

(60) Provisional application No. 63/295,307, filed on Dec. 30, 2021.

(51) Int. Cl.
*G06F 3/06* (2006.01)
(52) U.S. Cl.
CPC .......... *G06F 3/0619* (2013.01); *G06F 3/0659* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 9,805,782 B1 * | 10/2017 | Liou | G11C 11/4085 |
| 2008/0144390 A1 * | 6/2008 | Wu | G11C 7/12 365/185.23 |
| 2012/0063231 A1 * | 3/2012 | Wood | G11C 11/5628 365/185.18 |
| 2017/0075593 A1 * | 3/2017 | Kim | G06F 3/0653 |
| 2019/0006013 A1 * | 1/2019 | Lee | G11C 16/20 |
| 2019/0102104 A1 * | 4/2019 | Righetti | G06F 3/0688 |
| 2021/0065808 A1 * | 3/2021 | Wang | G11C 16/10 |

* cited by examiner

*Primary Examiner* — Jared I Rutz
*Assistant Examiner* — Alexander J Yoon
(74) *Attorney, Agent, or Firm* — Lowenstein Sandler LLP

(57) ABSTRACT

A memory device comprises an array of memory cells organized into a plurality of wordlines, and a processing device to perform processing operations that receive a program command specifying a memory unit and data comprising first received data, where the plurality of wordlines includes one or more first active data wordlines and a group of consecutive retired wordlines. The processing operations also program the specified data to the memory unit by programming the first received data to the one or more first active data wordlines, identifying a first retired boundary wordline that is in the group of consecutive retired wordlines and is adjacent to one of the first active data wordlines, generating a first data pattern comprising a first plurality of threshold voltage levels, and programming the first data pattern to the first retired boundary wordline.

17 Claims, 10 Drawing Sheets

500

510 Receive a program command specifying a target memory unit of a memory device and further specifying data comprising first received data, wherein the memory device includes a plurality of wordlines that includes one or more first active data wordlines and a group of consecutive retired wordlines

520 Program the specified data to the memory unit

530 Program the first received data to the one or more first active data wordlines

540 Identify a first retired boundary wordline that is in the group of consecutive retired wordlines and is adjacent to one of the first active data wordlines

550 Generate a first data pattern comprising a first plurality of threshold voltage levels

560 Program the first data pattern to the first retired boundary wordline

FIG. 5

SELECTIVELY PROGRAMMING RETIRED WORDLINES OF A MEMORY DEVICE

RELATED APPLICATION

This application claims the benefit of U.S. Provisional Application No. 63/295,307, filed Dec. 30, 2021, the content of which is hereby incorporated by reference in its entirety.

TECHNICAL FIELD

Embodiments of the disclosure relate generally to memory sub-systems, and more specifically, relate to selectively programming retired wordlines of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure. The drawings, however, should not be taken to limit the disclosure to the specific embodiments, but are for explanation and understanding only.

FIG. 5 is a flow diagram of an example method that programs a selected subset of the retired wordlines of a memory unit, including a retired boundary wordline, in accordance with some embodiments.

DETAILED DESCRIPTION

Figure 1A:
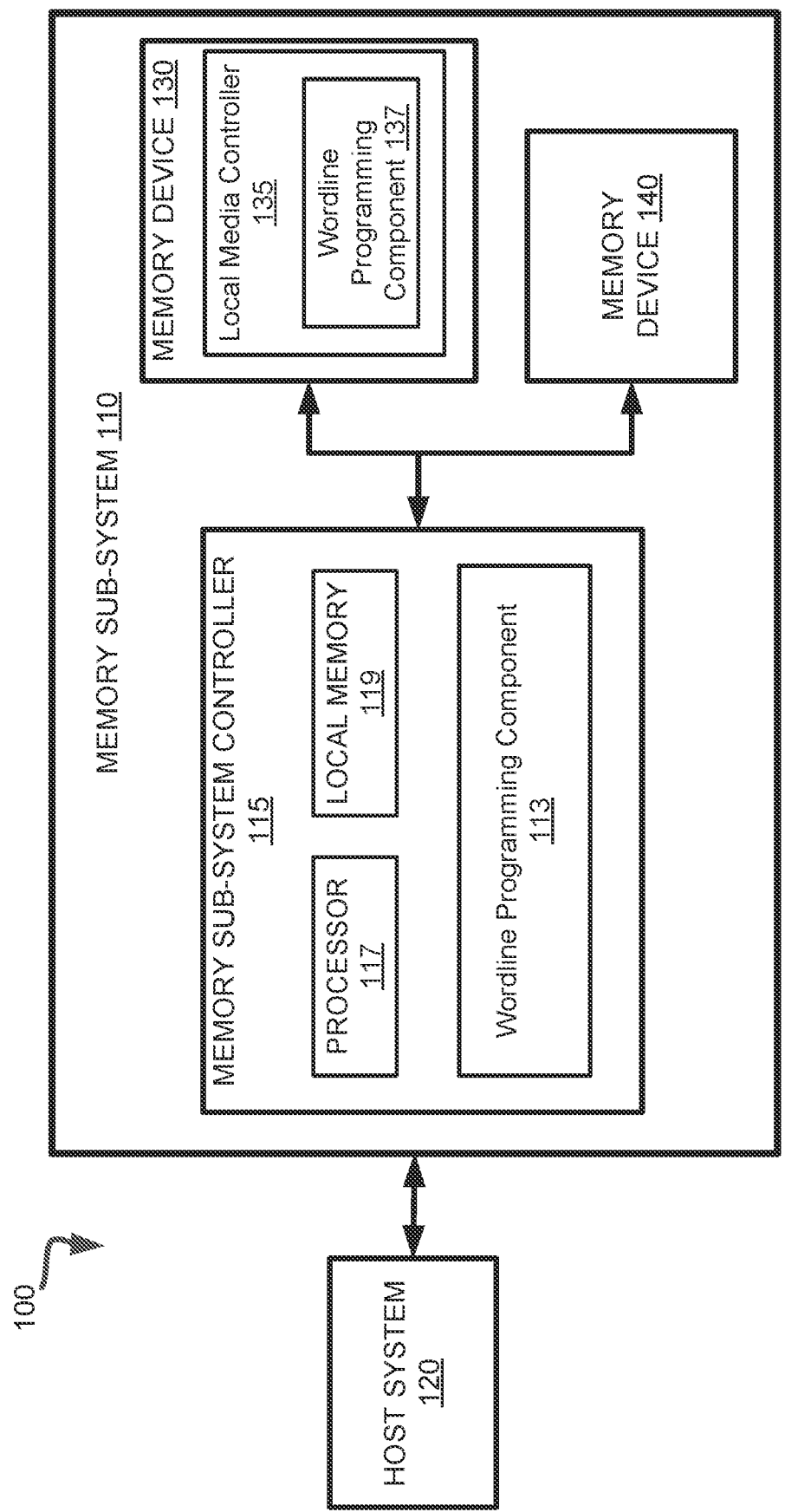
FIG. 1A illustrates an example computing system that includes a memory sub-system in accordance with some embodiments.

Aspects of the present disclosure are directed to selectively programming retired wordlines of a memory device. A memory sub-system can be a storage device, a memory module, or a combination of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. A memory unit can be, e.g., a page or other unit of storage. Each page consists of a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows multiple threshold voltage levels to be used, corresponding to different logical levels. Multiple threshold levels allow a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, a read operation can be performed by comparing the measured voltage exhibited by the memory cell to one or more threshold voltage levels in order to distinguish between two logical levels for single-level cells and between multiple logical levels for multi-level cells.

A memory device can include multiple bits arranged in a two-dimensional or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes.

In these memory devices, programming is performed to the array of memory cells sequentially, e.g., from a top (or lowest-numbered addresses) to a bottom (or highest-numbered addresses) of the array. This approach to programming follows best practices of using up all available memory and balancing program/erase (PE) cycles across the memory cells. Despite such efforts at wear leveling, however, after many PE cycles, some wordlines wear out before other wordlines. The level of wear of memory cells selectively connected to a wordline can be quantified by a reliability statistic, such as a read bit error rate (RBER) or other bit error rate of the wordline being detected that satisfies a threshold value. When the memory cells selectively connected to certain wordlines wear out, these wordlines can be retired. A retired wordline is no longer trusted to be programmed with host or system data because of unacceptably high error rates. For example, controller firmware can implement a background media scan operation to identify wordlines and/or blocks that should be retired (e.g., return high RBER), and store an indication of the retired wordlines in a list. The wordlines that are not retired continue to store host or system data, and are referred to herein as "active data wordlines."

In some memory sub-systems, although retired wordlines are not programmed with host or system data, the memory cells of the retired wordlines can still be programmed with dummy data because leaving these memory cells unwritten can create unwanted memory cell reliability ramifications at memory cells of active data wordlines. The dummy data is not subsequently read, but performing the programming operations on the retired wordlines prevents cell reliability problems. For example, skipping retired wordlines in programming operations can cause a region of negative pillar potential to develop. The negative pillar potential region can interact with cells of the active data wordlines, e.g., by reducing voltage levels at or near active data wordlines, thereby causing write disturb errors in which program operations can affect non-selected (e.g., inhibited) active data wordlines in addition to a selected wordline. The RBER of active data wordlines that are near the retired wordlines can increase as a result of the write disturb effects. As another example, lateral charge loss can occur as a result of not writing data to retired wordlines. A retired wordline has a minimal voltage, e.g., voltage level 0. If the retired wordline is adjacent to an active data wordline, then a cell of the retired wordline can be adjacent to and share a string (e.g., channel or bitline) with a cell of the active data bitline. If the active data cell has a higher voltage level, e.g., voltage level 7, there is a potential difference between the two cells, which can contribute to charge loss migration from the active data wordline to the retired wordline. The charge loss migration occurs for each cell on the affected wordlines, because each cell of the retired bitline has the level 0 charge. This charge loss migration can cause the higher-level voltage distributions (e.g., level 7 and level 6 voltage distributions for TLC) of the active data cell to overlap, thereby reducing data retention in the active data wordline.

Thus, to avoid the effects of negative pillar potential regions and charge loss migration, and maintain the performance of the active data cells, the retired wordlines can be programmed with dummy data prior to resuming host data writes to the active data cells. Some memory devices can program retired wordline cells with dummy data on a per-wordline and a per-sub-block basis. However, this programming of dummy data consumes time and system resources. For example, the host system has to wait for each dummy data write operation to complete before writing host data to the active cells. If a memory device is retiring 3 consecutive wordlines located across 4 sub-blocks, the host system would wait for a total page programming time ("tPROG") of 12 to retire all 3 wordlines across the 4 sub-blocks. Accordingly, programming retired wordlines with dummy data uses a substantial amount of time and system resources, which could otherwise be used to perform host or system read and write operations for host or system data. Thus, programming retired wordlines reduces performance of the memory sub-system as measured by metrics such as host write latency and throughput, since the retired wordlines do not store host or system data. However, the alternative of not programming retired wordlines leads to increased error rates because of the effects of negative pillar potential and charge loss migration. As the memory device ages, these deficiencies worsen over time, because the number of retired wordlines increases with wear on the memory device that occurs over time.

Aspects of the present disclosure address the above and other deficiencies by programming particular data patterns in selected retired wordlines that are adjacent to or near active data wordlines to mitigate the effects of non-programmed retired wordlines on the active data wordlines. The selected retired wordlines can be programmed, for example, as part of a programming operation that programs active data wordlines in the same memory unit. The selected retired wordlines that are programmed can be at the upper and lower boundaries of a consecutive group of retired wordlines of a memory device. The number of selected retired wordlines that are programmed per group of consecutive wordlines can be relatively small, e.g., two wordlines per group, and the other retired wordlines in the group need not be programmed.

The group of consecutive retired wordlines can include upper and lower retired wordlines, where upper and lower can refer to, e.g., relative physical positions or lowest and highest wordline numbers. Each of the upper and lower retired wordlines can be adjacent to a respective active data wordline that is outside the group. The group can also include, between the upper and lower retired wordlines, a number of retired inner wordlines that are separated from the active data wordlines by the upper and lower retired wordlines. The retired inner wordlines need not be programmed, because the programmed upper and lower retired wordlines mitigate the effects of the non-programmed retired wordlines on the active data wordlines, as described below.

The upper and lower retired wordlines can be programmed to a data pattern in which the value for each cell is a median threshold voltage level (e.g., level L4) between the lowest and highest threshold voltage levels of the memory device. Programming this pattern into the upper and lower retired wordlines insulates the negative pillar potential region of the non-programmed retired wordlines from the active data wordlines on the other sides of the upper and lower retired wordlines, since the median threshold voltage level (e.g., L4) programmed into the cells of the upper and lower retired wordlines raises the voltage in the negative pillar potential region. Further, programming the upper and lower retired wordlines to the median threshold voltage reduces the voltage differences between the upper retired wordline and its adjacent active data wordline, and between the lower retired wordline and its adjacent active data wordline. The reduction in voltage difference mitigates the lateral charge loss because fewer electrons flow across the reduced voltage difference. Since the retired inner wordlines are not programmed, the performance of the memory subsystem, e.g., in terms of host write latency and throughput, improves.

The active data wordlines can be further protected by programming an additional retired wordline near each end of the consecutive group of retired wordlines. The additional retired wordlines include a first retired inner wordline that is adjacent to the upper retired wordline and a second retired inner wordline that is adjacent to the lower retired wordline, and programming the four wordlines with corresponding data patterns. At the upper end of the group of retired wordlines, the upper retired wordline is programmed to a random pattern, in which each cell is programed to a randomly-chosen threshold voltage level (e.g., a level chosen at random from the range L0-L7), and each cell of the first retired inner wordline is programmed to a highest threshold voltage level (e.g., L7). Further, at the lower end of the group of retired wordlines, the lower retired wordline is programmed to a random pattern, which can be the same pattern used for the upper retired wordline, and each cell of the first retired inner wordline is programmed to the highest threshold voltage level (e.g., L7).

Programming the retired inner wordline adjacent to each of the upper and lower retired wordlines to the highest threshold level establishes a form of barrier between the negative pillar potential region of the non-programmed retired and the active data wordlines. The relatively high voltage level (e.g., L7) of each retired inner wordline compensates for the low voltage level of the negative pillar potential region. Further, the upper retired wordline is programmed to a set of randomly-selected threshold voltage levels. The position of the upper retired wordline between the adjacent active data wordline and the adjacent retired inner wordline insulates the adjacent active data wordline from the relatively high voltage level of the retired inner wordline. Without the upper retired wordline programmed to random levels being positioned between the active data wordline and the retired inner wordline, change loss migration could occur between cells of the retired inner wordline (e.g., L7) and adjacent cells of the active data wordline that are programmed to lower voltage levels (e.g., L0, L1, or L2). Thus, the two adjacent programmed retired wordlines at each end of the group of retired wordlines insulate the negative pillar potential region of the non-programmed retired wordlines from the active data wordlines on the other sides of the upper and lower retired wordlines.

Advantages of the present disclosure include, but are not limited to, improvements in performance of the memory sub-system because the number of retired wordlines that are programmed is reduced to a constant number, e.g., two or four wordlines per cluster of retired wordlines, instead of a quantity that increases over time. The principles of the present disclosure reduce the number of programming operations performed on retired wordlines, thereby improving the latency and throughput of programming operations performed on memory devices and reducing memory sub-system power consumption. Other advantages will be apparent to those skilled in the art of scanning of memory units within a memory sub-system discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system controller 115 includes a wordline programming component 113 that programs retired wordlines that are at or near a boundary between the retired wordlines and non-retired data wordlines. For example, the wordline programming component 113 can program particular data patterns in selected retired wordlines that are adjacent to or near active data wordlines to mitigate the effects of non-programmed retired wordlines on the active data wordlines. The selected retired wordlines can be programmed, for example, as part of a programming operation that programs active data wordlines in the same memory unit. The selected retired wordlines that are programmed can be at the upper and lower boundaries of a consecutive group of retired wordlines of a memory device, for example. The local media controller 136 can also include a wordline programming component 137 that can implement at least a portion of the operations described herein as being performed by the wordline programming component 113. For example, the memory sub-system controller's wordline programming component 113 can send commands to the local media controller's wordline programming 137 to cause the local media controller's wordline programming component 137 to perform operations such as programming particular wordlines or not programming (e.g., bypassing the programming of) particular wordlines of memory device 130. Further details regarding the operations of the wordline programming components 113, 137 are described below.

Figure 1B:
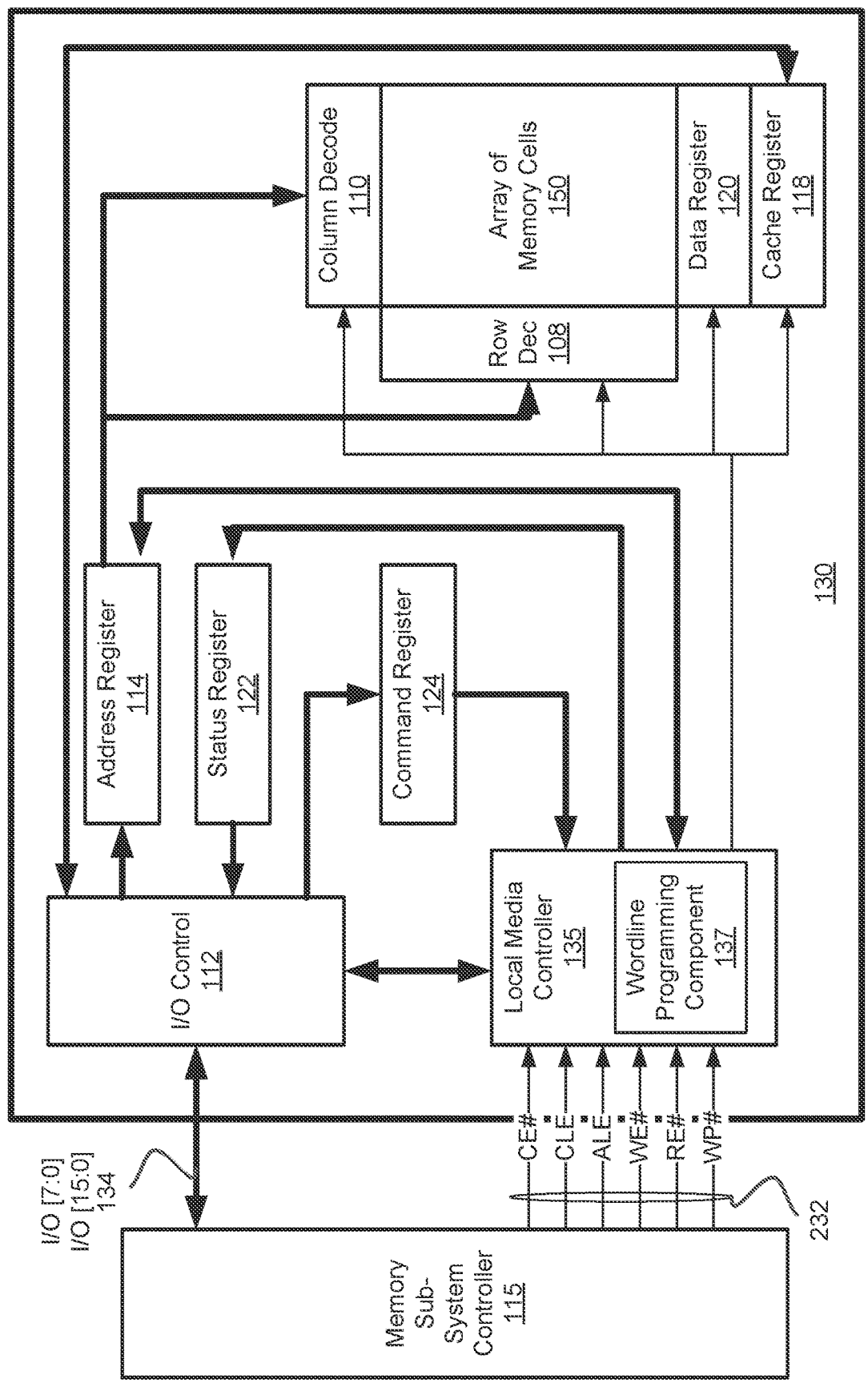
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a word line) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 250 are capable of being programmed to one of at least two target data states.

Row decode circuitry 108 and column decode circuitry 110 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 212 and row decode circuitry 108 and column decode circuitry 110 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 110 to control the row decode circuitry 108 and column decode circuitry 110 in response to the addresses. In one embodiment, local media controller 134 includes program manager 134, which can implement the all levels programming of memory device 130, as described herein.

The local media controller 135 is also in communication with a cache register 118. Cache register 118 latches data, either incoming or outgoing, as directed by the local media controller 135 to temporarily store data while the array of memory cells 150 is busy writing or reading, respectively, other data. During a program operation (e.g., write operation), data may be passed from the cache register 118 to the data register 120 for transfer to the array of memory cells 150; then new data may be latched in the cache register 118 from the I/O control circuitry 212. During a read operation, data may be passed from the cache register 118 to the I/O control circuitry 112 for output to the memory sub-system controller 115; then new data may be passed from the data register 120 to the cache register 118. The cache register 118 and/or the data register 120 may form (e.g., may form a portion of) a page buffer of the memory device 130. A page buffer may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 234 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 150.

In an embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
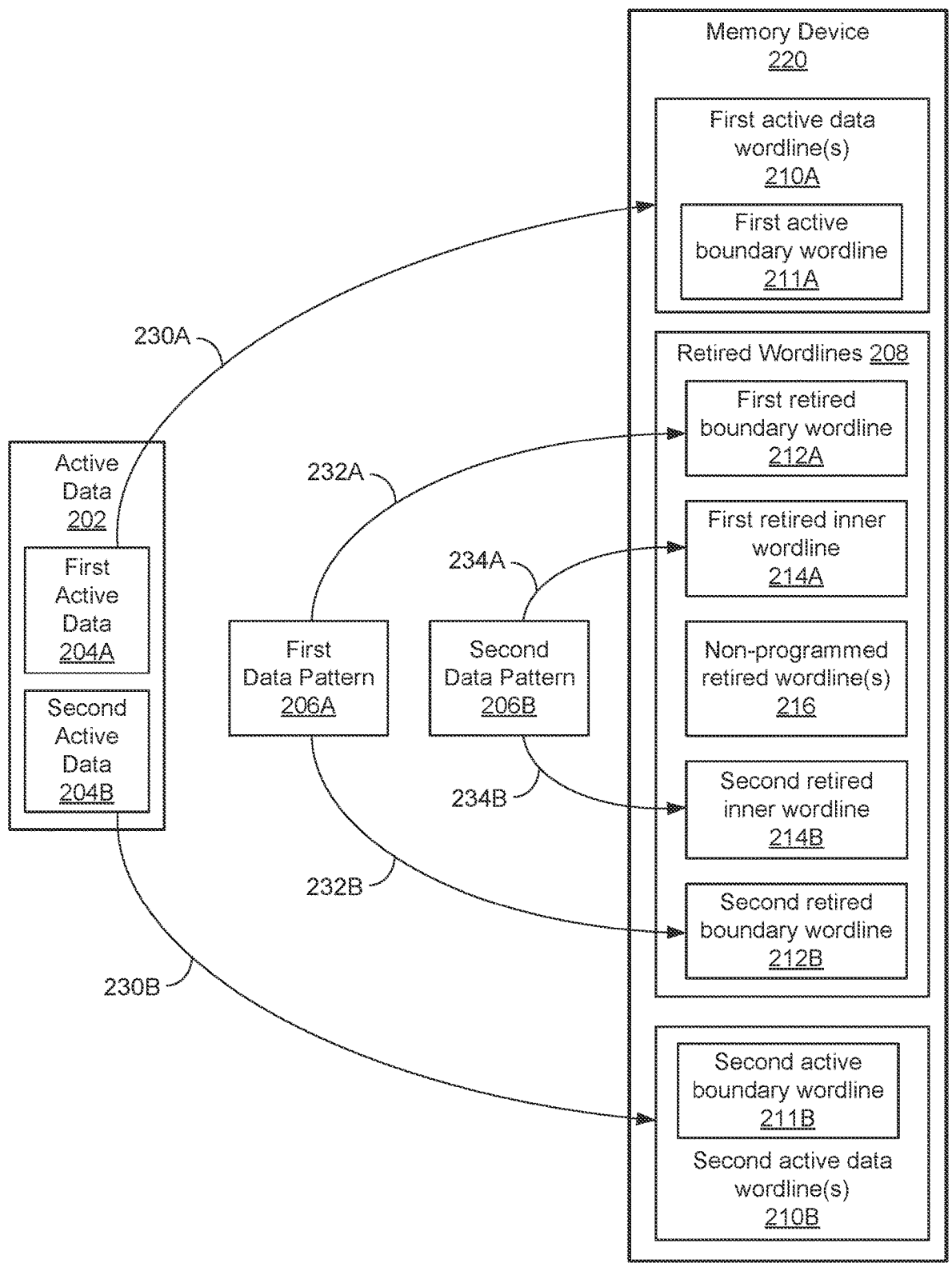
FIG. 2 illustrates an example programming of data patterns to retired wordlines in accordance with some embodiments.

FIG. 2 illustrates an example programming of data patterns 206 to retired wordlines 208 in accordance with some embodiments. A wordline programming component 113 can program (e.g., write) active data 202 to active wordlines 210 of a memory device 220 and further program one or more data patterns 206 to one or more respective selected retired wordlines 212, 214 of the memory device 220. The wordline programming component 113 can program first and second retired boundary wordlines 212 with a data pattern in which the value for each cell is a median threshold voltage level (e.g., level L4) between the lowest and highest threshold voltage levels of the memory device 130. Programming this pattern into the first and second retired boundary wordlines 212 insulates a negative pillar potential region of the non-programmed retired wordlines 216 from the active data wordlines 210 on the other sides of the boundary retired wordlines 212, since the median threshold voltage level (e.g., L4) programmed into the cells raises the voltage at the first and second retired boundary wordlines 212, thereby compensating for the effect of the negative pillar potential region. As described above, the negative pillar potential region can result from skipping retired wordlines 208 when programming active data wordlines 210. The negative pillar potential region can interact with cells of the active data wordlines 210, e.g., by reducing voltage levels at or near active data wordlines 210. The reduced voltage can cause write disturb errors in which program operations can affect non-selected (e.g., inhibited) active data wordlines 210 in addition to a selected wordline of the active data wordlines 210. Thus, if the retired wordlines 208 are not programmed when the active data wordlines 210 are programmed, the RBER of active data wordlines 210 that are near the non-programmed retired wordlines 208 can increase as a result of the write disturb effects. Programming the first retired boundary wordline 212A and/or 212B can mitigate the effects of the negative pillar potential, thereby preventing the increase RBER of the active data wordlines 210. Further, programming the retired boundary wordlines 212 to the median threshold voltage reduces the voltage difference between each retired boundary wordline 212 and nearby active data wordlines 210, such as the active boundary wordlines 211. The reduction in voltage difference mitigates the lateral charge loss because fewer electrons flow across the reduced voltage difference. The charge loss can cause the charge distribution in an active data wordline 210 to cross a threshold voltage boundary, thereby increasing the probability of bit read errors. Reducing the charge loss reduces changes in the charge stored in the active boundary wordlines 210, so the charge distribution of each active boundary wordline 210 does not become more likely to cross a threshold voltage boundary.

The active wordlines 210 can include first active data wordline(s) 210A and second active data wordline(s) 210B, which can be on an opposite side of the retired wordlines 208 from the first active data wordline(s) 210A. The active data 202 can include first active data 204A and second active data 204B. The first active data 204A can be stored on the first active data wordline(s) 210A and the second active data 204B can be stored on the second active data wordline(s) 210B. The active data 202 can be, e.g., host or system data.

The first active data wordline(s) 210A include a first active boundary wordline 211A, which can be adjacent to a first retired boundary wordline 212A. A first retired inner wordline 214A can be located on an "inner" side of the first retired boundary wordline 212A, e.g., adjacent to the first retired boundary wordline 212A. The first retired inner wordline 214A can be adjacent to one of the non-programmed retired wordline(s) 216. Adjacent wordlines can be, e.g., wordlines that are not separated by another wordline between the adjacent wordlines.

The retired wordlines 208 can be wordlines that were previously active data wordlines prior to being retired. An active data wordline can be retired as described above (e.g., if the active data wordline is determined to be unreliable). The retired wordlines 208 can store data, such as data patterns 206, but the memory sub-system 110 does not ordinarily read data from the retired wordlines 208. In some example, the wordlines of memory device 220 can be programmed in sequence from a first wordline (e.g., a first one of the first data wordlines 210A) to a last wordline (e.g., a last one of the second data wordlines 210B), though one or more wordlines, such as non-programmed retired wordlines 216, can be omitted from programming operations. For example, local media controller 134 can program particular wordlines specified by the wordline programming components 113, 137, such as the active data wordlines 210, and not program other wordlines, such as the non-programmed retired wordlines 216, as specified by the wordline programming components 113, 137.

As described above, leaving the retired wordlines 208 unwritten (e.g., while the active data wordlines 210 have been more recently written) can cause unwanted effects that can reduce the reliability of memory cells of the active data wordlines 210. The wordline programming component 113 can mitigate the unwanted effects by programming particular data patterns 206 in selected retired wordlines 212, 214 that are adjacent to or near active data wordlines 210. Since the selected retired wordlines 212, 214 can be a fixed-size subset of the retired wordlines 208 that contains a relatively small number of retired wordlines, programming the data patterns 206 in the selected retired wordlines 212, 214 is more efficient than existing techniques that involve programming dummy data in all of the retired wordlines 208.

The wordline programming component 113 can program selected retired wordlines 212, 214 of the memory device 220 in response to receiving or performing a program command that programs active data 202 to one or more of the active data wordlines 210 of the memory device 220. The wordline programming component 113 can receive the program command from the host system 120 or from another component of the memory sub-system controller 115, for example. In other examples, the wordline programming component 113 can program the selected retired wordlines at other times, e.g., at periodic times as part of a defect scan.

For example, if the memory sub-system controller 115 performs a write operation that writes host data or system data (e.g., data used by the memory sub-system 110), then the memory sub-system controller wordline programming component 113 and/or the local media controller wordline programming component 137 can perform program operations 232, 234 that program the data patterns 206 to the selected retired wordlines 212, 214, without programming the non-programmed retired wordlines 216. Further, the wordline programming component 113 and/or the wordline programming component 137 program the active data 202 to the active data wordlines 210 (operations 230), and cant program data patterns 206 to the retired wordlines 208

(operations 232, 234). For example, the wordline programming component 113 can perform a programming operation 230A to program the first active data 204A to the first active data wordline(s) 210A, and a programming operation 230B to program the second active data 204B to the second active data wordline(s) 210B. Alternatively, other components of the memory sub-system 110 can perform the programming operations 230, 232, 234.

Figure 3:
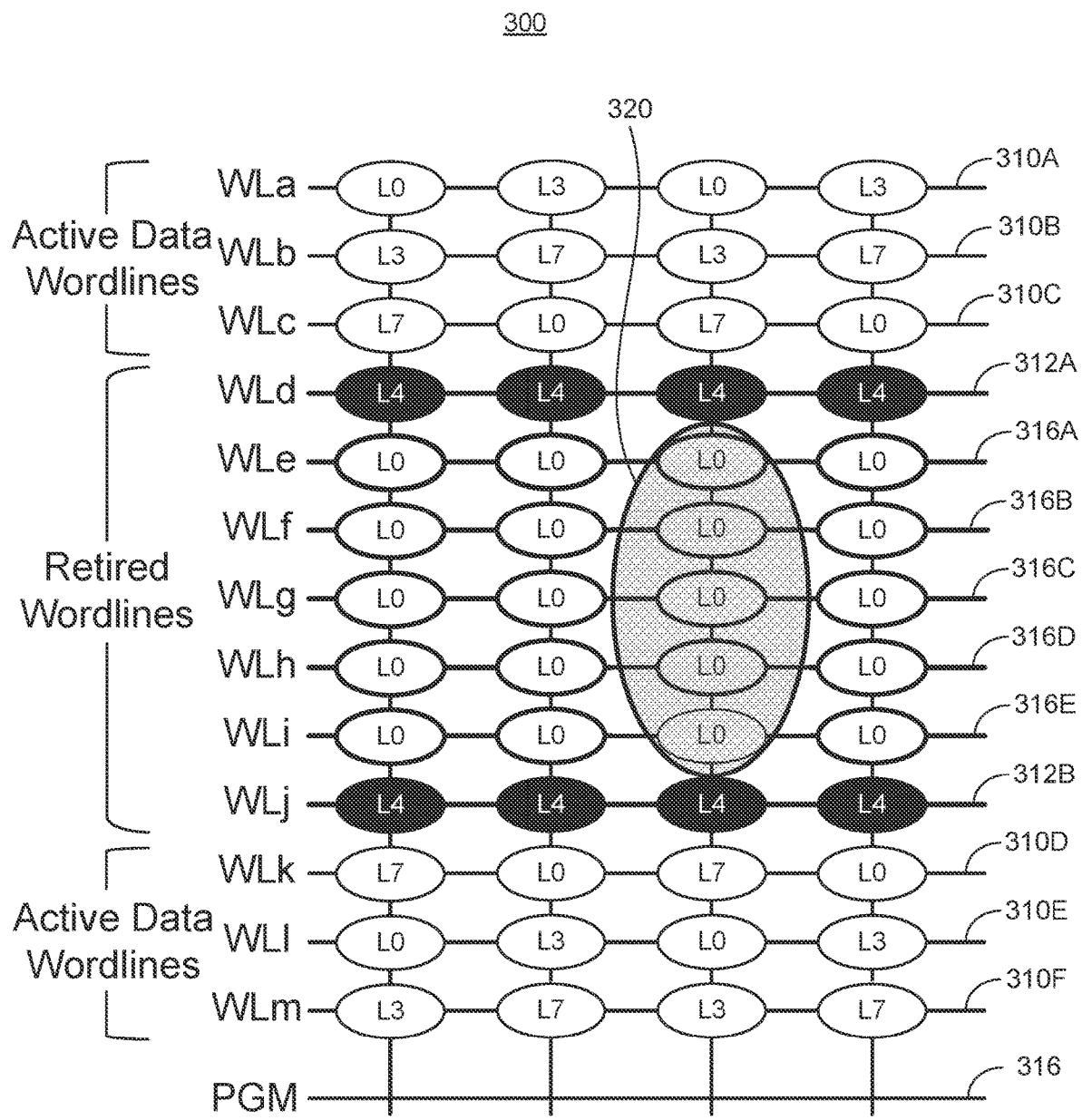
FIG. 3 illustrates example programming of data patterns to cells of retired boundary wordlines in accordance with some embodiments.

The wordline programming component 113 can perform a programming operation 232A to cause a first data pattern 206A to be programmed by the local media controller 135 to a retired boundary wordline 212A. The first data pattern 206A can be, e.g., a sequence of median threshold voltage level values, such as a sequence of L4 values for a triple-level memory device, as described below. The first data pattern 206A can provide a form of insulation between a region of negative pillar potential produced by the non-programmed retired wordline(s) 216 and the active data wordline(s) 210A. The first data pattern 206A can also reduce the difference in threshold voltages of the active boundary wordline 211A and the retired boundary wordline 212A, thereby mitigating lateral charge loss issues. Further, the first data pattern 206A can mitigate geometric proximity artifacts between the active boundary wordline 211A and the retired boundary wordline 212A. The geometric proximity artifacts can be, for example, the lateral charge loss and negative pillar artifacts described herein. An example first data pattern 206A that includes a sequence of median threshold voltage level values and is programmed to a first retired boundary wordline 212A is shown in FIG. 3.

The first data pattern 206A can be, for example, a sequence of threshold voltage levels, each of which is programmed to a respective memory cell of the retired boundary wordline 212A. Each threshold voltage level can one of the threshold voltage levels of the memory device 220, e.g., one of Level 0-7 ("L0"-"L7") for a memory device 220 in which each cell has 8 threshold voltage levels, such as a triple-level memory cell. The first data pattern 206A can be, for example, a sequence of median level values such as L4, which causes the boundary WL program command 232A to program the voltage value that corresponds to L4 to each cell of the retired boundary wordline 212A. If each wordline of an example memory device 220 has four cells, then an example first data pattern 206A is L4, L4, L4, L4. In other examples, the first data pattern 206A can be a sequence of random threshold voltage levels, such as L0, L3, L7, L3, or any other suitable sequence of threshold voltage levels. Although particular example wordline sizes and threshold voltage levels are described herein, any suitable wordline sizes and threshold voltage levels can be used, such as the wordline sizes and threshold voltage levels of a particular memory device 220.

Figure 4:
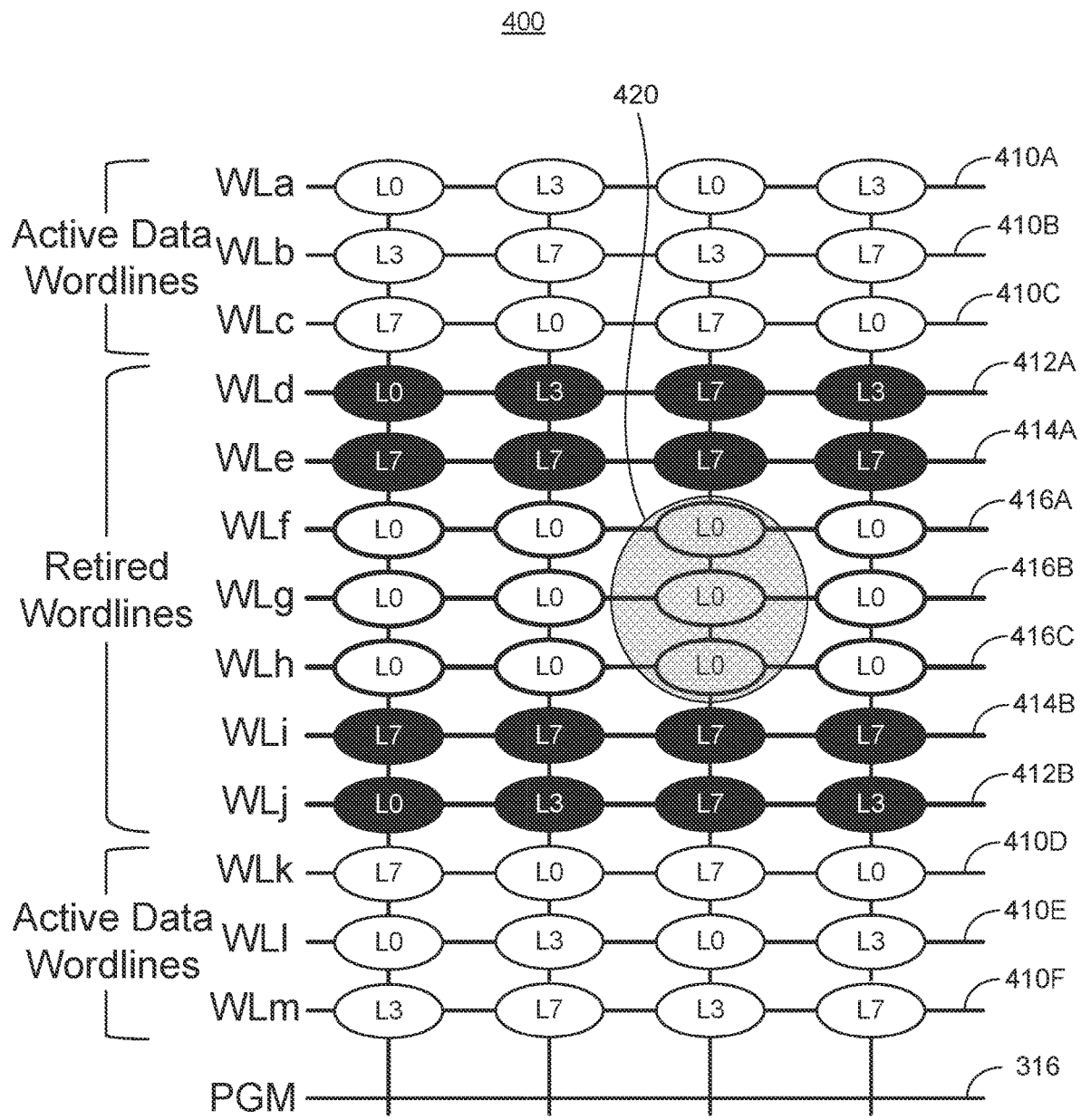
FIG. 4 illustrates example programming of data patterns to cells of retired boundary wordlines and retired inner wordlines in accordance with some embodiments.

The negative pillar potential effects caused by the non-programmed retired wordline(s) 216 can be further reduced by programming a retired wordline adjacent to the first active boundary wordline 211A with a higher threshold voltage level (e.g., L7 in each cell) than the median level described above (e.g., L4 in each cell), since the higher threshold voltage level provides an additional positive offset to the negative pillar potential. However, if the higher threshold voltage level is programmed to the retired inner wordline 214A, a charge gain is likely to occur on cells of the active boundary wordline 211A, particularly for cells that store a value corresponding to a low threshold voltage level, such as L0. Thus, to prevent the charge gain on the active boundary wordline 211A, a pair of retired wordlines 208 can be programmed. The retired boundary wordline 212A can be programmed with a pattern of random threshold voltages that are likely to be similar to the voltages in the cells of the active boundary wordline 211A (operation 232A). The retired inner wordline 214A can separate the active boundary wordline 211A from a retired inner wordline 214A, which can be programmed with the higher (e.g., L6 in each cell) or highest threshold voltage level (e.g., L7 in each cell) (operation 234A). The retired boundary wordline 212A thus insulates the active data wordline(s) 210A from the higher or highest levels in the retired inner wordline 214A, and reduces charge loss. FIG. 4 shows an example in which a first data pattern 206A that includes a sequence of random threshold voltage levels is programmed to retired boundary wordlines 212, and a second data pattern 206B that includes a sequence of high threshold voltage levels is programmed to retired inner wordlines 214.

The wordline programming component 113 can additionally or alternatively perform a programming to program the second (e.g., lower) retired boundary wordline 212B (operation 232B). The programming operation 232B can be similar to the programming operation 232A described above. Further, the wordline programming component 113 can additionally or alternatively program the second (e.g., lower) retired inner wordline 214B (operation 234B). The programming operation 234B can be similar to the programming operation 234A described above. The second (e.g., lower) active data wordline(s) 210B can include a second active boundary wordline 211B, which can be adjacent to a second retired boundary wordline 212B. A second (e.g., lower) retired inner wordline 214B can be located on an "inner" side of the second retired boundary wordline 212B, e.g., adjacent to the second retired boundary wordline 212B. The second retired inner wordline 214B can be adjacent to one of the non-programmed retired wordline(s) 216.

Thus, wordline programming component 113 can perform the programming operation 232B to program the first data pattern 206A to the second retired boundary wordline 212B, and can perform the programming operation 234B to program the second data pattern 206B to the second retired inner wordline 214B. The effects of programming the first data pattern 206A to the second retired boundary wordline 212B and programming the second data pattern 206B to the second retired inner wordline 214B are similar to the effects described above with reference to the programming operations 232A, 234A.

FIG. 3 illustrates example programming of data patterns to cells 300 of retired boundary wordlines in accordance with some embodiments. The memory cells 300 can be in an array of memory cells 150 of a memory device 130. In the example of FIG. 3, each cell of an "upper" retired boundary wordline WLd 312A and a "lower" retired boundary WLj 312B is programmed to a median threshold voltage level L4. Programming the retired boundary wordlines 312A, 312B in this way insulates the active data wordlines 310A, 310B from effects of the non-programmed retired wordlines WLe 316A—WLi 316E, such as voltage changes caused by a region of negative pillar potential 320, and charge loss to the non-programmed retired wordlines 316, as described above with respect to FIG. 2.

A wordline programming component 113 can program data patterns 206 to the memory cells 300 as described above with reference to FIG. 2. Referring to the example of FIG. 3, the wordline programming component 113 has programmed first active data 204A to three active data wordlines 310A-310C. The active data wordlines 310 include a wordline WLa 310A, a wordline WLb 310B, and a wordline WLc 310C. The cells of wordlines 310A-310C are programmed with active data as shown. For example, the first cell of WLa 310A is programmed with the value L0, which is the threshold voltage level 0 of the memory device 130. Further, the second through fourth cells of wordline WLa 310A are programmed with the values L3, L0, and L3, respectively. Wordlines 310A-310C can correspond to the active data wordlines 210A of FIG. 2.

The wordline programming component 113 has programmed a first data pattern 206A, which is a sequence of median threshold voltage (L4) values in this example, to wordline WLd 312A. Thus, each cell of wordline WLd 312A is storing the voltage of level L4, which corresponds to the fourth threshold voltage level of the memory device 130. Wordline WLd 312A corresponds to the first retired boundary wordline 212A of FIG. 2. Programming the sequence of median threshold voltage values L4, L4, L4, L4 to wordline WLd 312A causes the cells of Wordline WLd 312A to act as a form of insulation between a region or regions of negative pillar potential 320 that can be formed by the non-programmed retired cells on wordlines WLe 316A through WLi 316E.

Retired wordlines WLe 316A through Wli 316E have not been programmed since a time at which they were retired or erased. Thus, each retired wordline 316A-316E is storing the voltage of level L0. Retired wordlines 316A-316E correspond to the non-programmed retired wordline(s) 216 of FIG. 2.

The wordline programming component 113 has programmed a first data pattern 206A, which is a sequence of median threshold voltage (L4) values in this example, to wordline WLj 312B. Thus, each cell of wordline WLd 312A is storing the voltage of level L4, which corresponds to the fourth threshold voltage level of the memory device 130. Wordline WLj 312B corresponds to the second retired boundary wordline 212B of FIG. 2.

The wordline programming component 113 has programmed second active data 204B to three active data wordlines 310F-310F. The cells of wordlines WLk 310D-WLm 310F are programmed with active data as shown. For example, wordline WLm 310F is programmed with the data sequence L3, L7, L3, L7. Wordlines WLk 310D—WLm 310F correspond to the active data wordlines 210B of FIG. 2. Each of the cells 300 is formed by an intersection of the cell's wordline and a respective bitline. The bitlines intersect a program (PGM) line, which can be used to address particular cells in a programming operation.

FIG. 4 illustrates example programming of data patterns to cells 400 of retired boundary wordlines and retired inner wordlines in accordance with some embodiments. A wordline programming component 113 has programmed active data to "upper" active data wordlines 410A-410C and "lower" active data wordlines 410D-410F with the same values shown in the corresponding wordlines 310A-310C and 310D-310F of FIG. 3. Retired wordlines WLf 416A through Wlh 416C have not been programmed since being retired or erased. Thus, each retired wordline 416A-416F is storing the voltage of level L0.

The wordline programming component 113 can program data patterns 206 to the memory cells 400 as described above with reference to FIG. 2. In the example of FIG. 4, a pair of "upper" retired wordlines WLd 412A and WLe 414A are programmed to data patterns so that the pair of upper wordlines insulates the "upper" active data wordlines 410A-410C from effects of the non-programmed retired wordlines WLf 416A-WLh 416C, such as voltage changes caused by a region of negative pillar potential 420, and charge loss to the non-programmed retired wordlines 416. Further, a pair of "lower" retired wordlines WLj 412B and WLi 414B are programmed to data patterns so that the pair of lower wordlines insulates the "lower" active data wordlines 410D-410F from effects of the non-programmed retired wordlines WLf 416A-WLh 416C To insulate the "upper" active data wordlines 410A-410C from the effects of the non-programmed retired wordlines 416, each of the cells of the "upper" retired boundary wordline WLd 412A is programmed to a respective random threshold voltage level that can be different for each cell, and each of the cells of the "upper" retired inner wordline WLe 414A is programmed to a highest threshold voltage level L7. The retired inner wordline WLe 414A, which is programmed to a sequence of L7 voltages, which can reduce the negative pillar potential effects on the "upper" active data wordlines 410A-410C caused by the non-programmed retired wordlines 416 as described above with respect to FIG. 2. The reduction can be greater than the reduction provided by the median voltage level pattern shown in FIG. 3, since the higher voltage level (e.g., L7) can overcome the low voltage of the negative pillar potential 420 to a greater degree than the median voltage level (e.g., L4). However, to prevent the higher voltage levels of the retired inner wordline WLe 414A from causing charge gain on the active data wordlines 410, the retired boundary wordline WLd 412A is programmed to the sequence of random threshold voltage levels. The random threshold voltage values are L0, L4, L7, L4 in this example. Thus, a different random threshold value can be stored in each cell of wordline WLd 412A.

To insulate the "lower" active data wordlines 410D-410F from the effects of the non-programmed retired wordlines 416, each of the cells of the "lower" retired boundary wordline WLj 412B is programmed to a respective random threshold voltage level that can be different for each cell, and each of the cells of the "lower" retired inner wordline WLi 414B is programmed to a highest threshold voltage level L7. The retired inner wordline WLi 414B, which is programmed to a sequence of L7 voltages, which can reduce the negative pillar potential effects on the "lower" active data wordlines 410D-410F caused by the non-programmed retired wordlines 416 as described above with respect to FIG. 2. The reduction can be greater than the reduction provided by the median voltage level pattern shown in FIG. 3, since the higher voltage level (e.g., L7) can overcome the low voltage of the negative pillar potential 420 to a greater degree than the median voltage level (e.g., L4). However, to prevent the higher voltage levels of the retired inner wordline WLi 414B from causing charge gain on the active data wordlines 410D-410F, the retired boundary wordline WLj 412B is programmed to the sequence of random threshold voltage levels. The random threshold voltage values are L0, L4, L7, L4 in this example. Thus, a different random threshold value can be stored in each cell of wordline WLj 412B.

FIG. 5 is a flow diagram of an example method 500 that programs a selected subset of the retired wordlines of a memory unit, including a retired boundary wordline, in accordance with some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the wordline programming component 113 and/or 137 of FIG. 1A.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a program command specifying a memory unit of a memory device and further specifying data comprising first received data, wherein the memory device includes a plurality of wordlines that includes one or more first active data wordlines and a group of consecutive retired wordlines. The program command can also specify a physical address that identifies the memory unit.

At operation 520, the processing logic programs the specified data to the memory unit. In some embodiments, programming the specified data to the memory unit does not program at least one of the group of consecutive retired wordlines. Operation 520 includes operations 530-550. At operation 530, the processing logic programs the first received data to the one or more first active data wordlines. To program the first received data to the one or more first active data wordlines, the processing logic can cause the first received data to be programmed to a plurality of memory cells of the memory unit, wherein the plurality of memory cells corresponds to the one or more first active data wordlines.

At operation 540, the processing logic identifies a first retired boundary wordline that is in the group of consecutive retired wordlines and is adjacent to one of the first active data wordlines. At operation 550, the processing logic generates a first data pattern comprising a first plurality of threshold voltage levels. In some embodiments, each of the first plurality of threshold voltage levels is determined based on a respective pseudo-random value. In other embodiments, each of the first plurality of threshold voltage levels is a median threshold voltage level between a lowest threshold voltage level and a highest threshold voltage level of the memory device.

At operation 560, the processing logic programs the first data pattern to the first retired boundary wordline. To program the first data pattern to a first retired boundary wordline, the processing unit can cause the first data pattern to be programmed to a plurality of memory cells of the memory unit, such that the plurality of memory cells corresponds to a first retired boundary wordline that is adjacent to one of the first active data wordlines.

The memory device can further include a plurality of bitlines, each of the plurality of wordlines can intersect one of the bitlines, and each of the first plurality of threshold voltage levels can correspond to a respective one of the bitlines. Further, each of the first plurality of threshold voltage levels can be programmed to a respective one of the memory cells that is located at an intersection between the first retired boundary wordline and a respective one of the bitlines.

In some embodiments, to program the specified data to the memory unit, at operation 520 the processing logic can identify a first retired inner wordline of the group of consecutive retired wordlines, wherein the first retired inner wordline is adjacent to the first retired boundary wordline, and the first retired inner wordline is separated from the one or more first data active wordlines by the first retired boundary wordline. The processing logic can further generate a second data pattern comprising a second plurality of threshold voltage levels, and program the second data pattern to the first retired inner wordline, wherein each of the second plurality of threshold voltage levels can be a highest threshold voltage level of the memory device, and each of the first plurality of threshold voltage levels can be determined based on a respective pseudo-random value.

In some embodiments, the plurality of wordlines further includes one or more second active data wordlines, wherein the one or more second active data wordlines are separated from the one or more first active data wordlines by the group of consecutive retired wordlines. Further, the group of consecutive retired wordlines also includes a second retired boundary wordline that is adjacent to one of the second active data wordlines. Further, to program the specified data to the memory unit, at operation 520 the processing logic can program the first data pattern to the second retired boundary wordline. The specified data can further include second received data, in which case at operation 520 the processing logic can program the second received data to the one or more second active data wordlines. Further, each of the second plurality of threshold voltage levels can be a highest threshold voltage level of the memory device, and each of the first plurality of threshold voltage levels can be determined based on a respective pseudo-random value In some embodiments, to program the specified data to the memory unit, at operation 520 the processing logic can identify a first retired inner wordline and a second retired inner wordline of the group of consecutive retired wordlines, wherein the first retired inner wordline is adjacent to the first retired boundary wordline, and the second retired inner wordline is adjacent to the second retired boundary wordline, generate a second data pattern comprising a second plurality of threshold voltage levels, and program the second data pattern to the first retired inner wordline and to the second retired inner wordline. Further, each of the second plurality of threshold voltage levels can be a highest threshold voltage level of the memory device, and each of the first plurality of threshold voltage levels can be determined based on a respective pseudo-random value.

Figure 6:
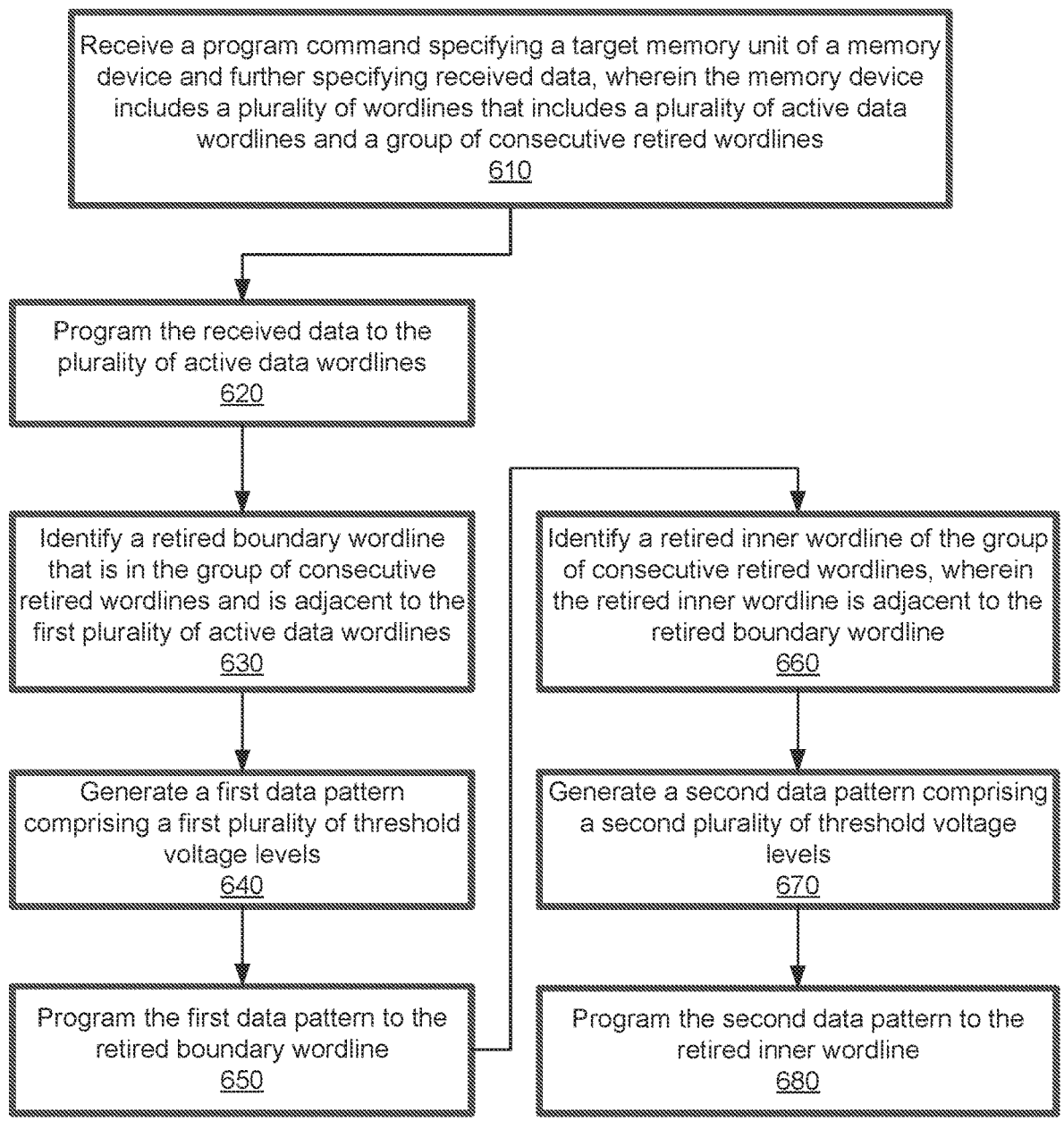
FIG. 6 is a flow diagram of an example method that programs a selected subset of retired wordlines that includes a retired boundary wordline and a retired inner wordline, in accordance with some embodiments.

FIG. 6 is a flow diagram of an example method 600 that programs a selected subset of retired wordlines that includes a retired boundary wordline and a retired inner wordline, in accordance with some embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the wordline programming component 113 and/or 137 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic receives a program command specifying a memory unit of a memory device and further specifying received, wherein the memory device includes a plurality of wordlines that includes a plurality of active data wordlines and a group of consecutive retired wordlines. For example, with respect to FIG. 4, the active data wordlines are WLa-WLc and WLk-WLm, and the group of consecutive retired wordlines is WLd-WLj. At operation 620, the processing logic programs the received data to the plurality of active data wordlines. For example, with respect to FIG. 4, the processing logic can program the received data to wordlines WLa-WLc and/or to wordlines WLk-WLm.

At operation 630, the processing logic identifies a retired boundary wordline that is in the group of consecutive retired wordlines and is adjacent to the first plurality of active data wordlines. For example, the processing logic can identify the retired boundary wordline WLd, which is a retired boundary wordline because it is a closest retired wordline to the boundary between the active data wordlines WLa-WLc and the retired wordlines WLd-WLj. In another example, the processing logic can identify the retired boundary wordline as being WLj instead of WLd, because WLj is a closest retired wordline to the boundary between the active data wordlines WLk-WLm and the retired wordlines WLd-WLj.

At operation 640, the processing logic generates a first data pattern comprising a first plurality of threshold voltage levels. The first data pattern can be, for example, a random sequence of threshold voltage levels, such as the sequence L0, L4, L7, L4 shown in wordline WLd of FIG. 4. At operation 650, the processing logic programs the first data pattern to the retired boundary wordline. For example, the result of programming the random sequence of threshold voltage levels to the four example cells of wordline WLd is shown in FIG. 4. At operation 660, the processing logic identifies a retired inner wordline of the group of consecutive retired wordlines, wherein the retired inner wordline is adjacent to the retired boundary wordline. For example, the processing logic can identify the retired inner wordline WLe, which is adjacent to the retired boundary wordline WLd.

At operation 670, the processing logic generates a second data pattern comprising a second plurality of threshold voltage levels. The second data pattern can be, for example, a sequence of high threshold voltage levels (e.g., L6 or L7) or a sequence of highest threshold voltage levels (e.g., L7). In FIG. 4, the second data pattern is a sequence of L7 threshold voltage levels. At operation 680, the processing logic programs the second data pattern to the retired inner wordline, e.g., WLe in FIG. 4.

Figure 7:
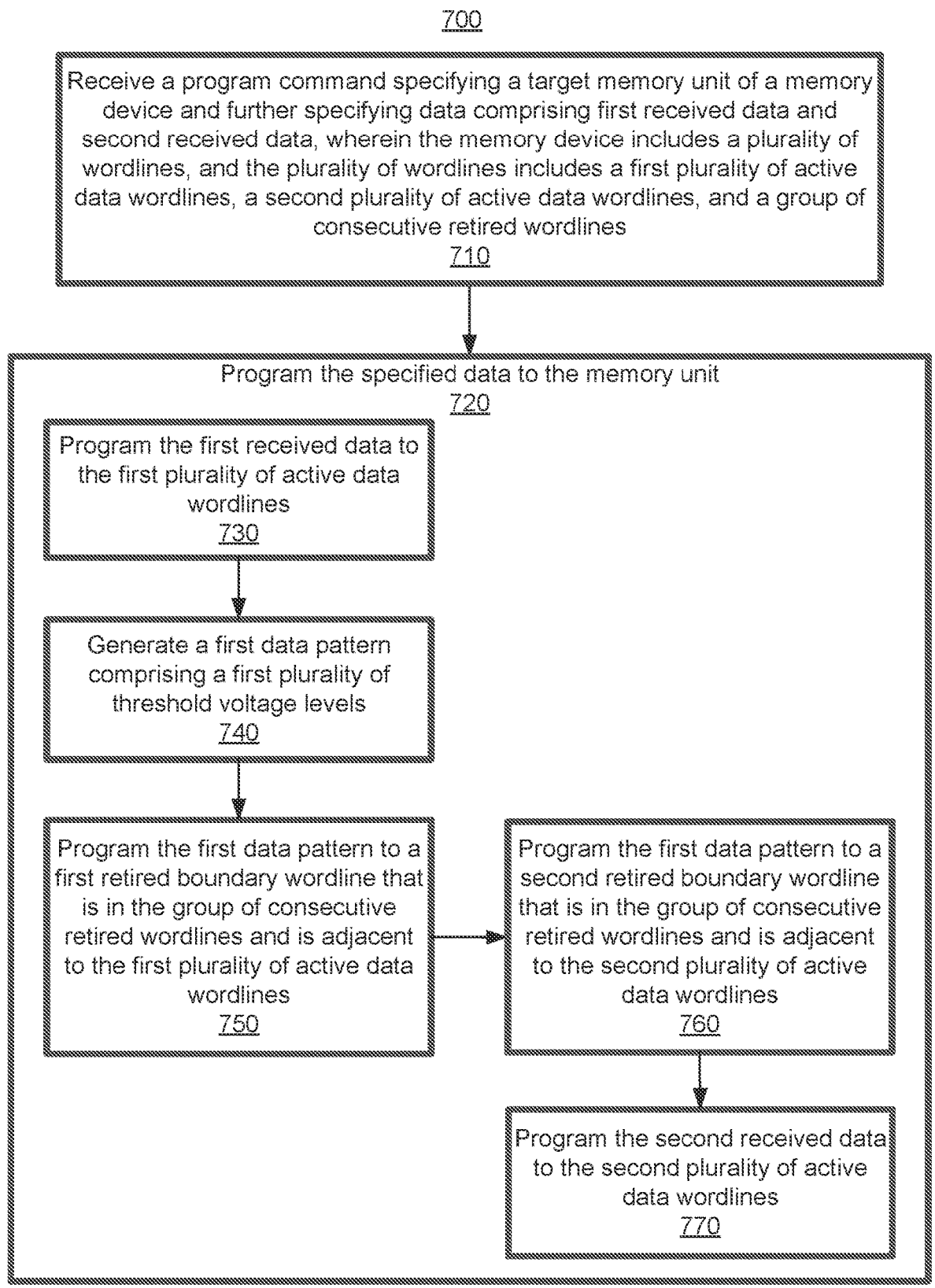
FIG. 7 is a flow diagram of an example method that programs a selected subset of retired wordlines that includes first and second retired boundary wordlines, in accordance with some embodiments.

FIG. 7 is a flow diagram of an example method 700 that programs a selected subset of retired wordlines that includes a retired boundary wordline and a retired inner wordline, in accordance with some embodiments. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the wordline programming component 113 and/or 137 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic receives a program command specifying a memory unit of a memory device and data comprising first received data and second received data, wherein the memory device includes a plurality of wordlines, and the plurality of wordlines includes a first plurality of active data wordlines, a second plurality of active data wordlines, and a group of consecutive retired wordlines. At operation 720, the processing logic programs the received data to the memory unit. Operation 720 can include operations 730-770. At operation 730, the processing logic programs the first received data to the first plurality of active data wordlines. For example, with respect to FIG. 3, the first received data can be programmed to wordlines WLa-WLc, and the values of the received data are shown in the cells of wordline WLd.

At operation 740, the processing logic generates a first data pattern comprising a first plurality of threshold voltage levels. The first data pattern can be, for example, a sequence of median threshold voltage levels, such as the sequence L4, L4, L4, L4 for a wordline of four cells.

At operation 750, the processing logic programs the first data pattern to a first retired boundary wordline that is in the group of consecutive retired wordlines and is adjacent to the first plurality of data wordlines. For example, first retired boundary wordline can be wordline WLd of FIG. 3, and the result of programming the sequence of median threshold voltage levels to the four example cells of wordline WLd is shown in FIG. 3.

At operation 760, the processing logic programs the first data pattern to a second retired boundary wordline that is in the group of consecutive retired wordlines and is adjacent to the second plurality of active data wordlines. For example, second retired boundary wordline can be wordline WLj of FIG. 3, and the result of programming the sequence of median threshold voltage levels to the four example cells of wordline WLj is shown in FIG. 3. At operation 770, the processing logic programs the second received data to the second plurality of data wordlines. For example, the result of programming the second received data to the data wordlines is shown in the cells of data wordlines WLk-WLm of FIG. 3.

Figure 8:
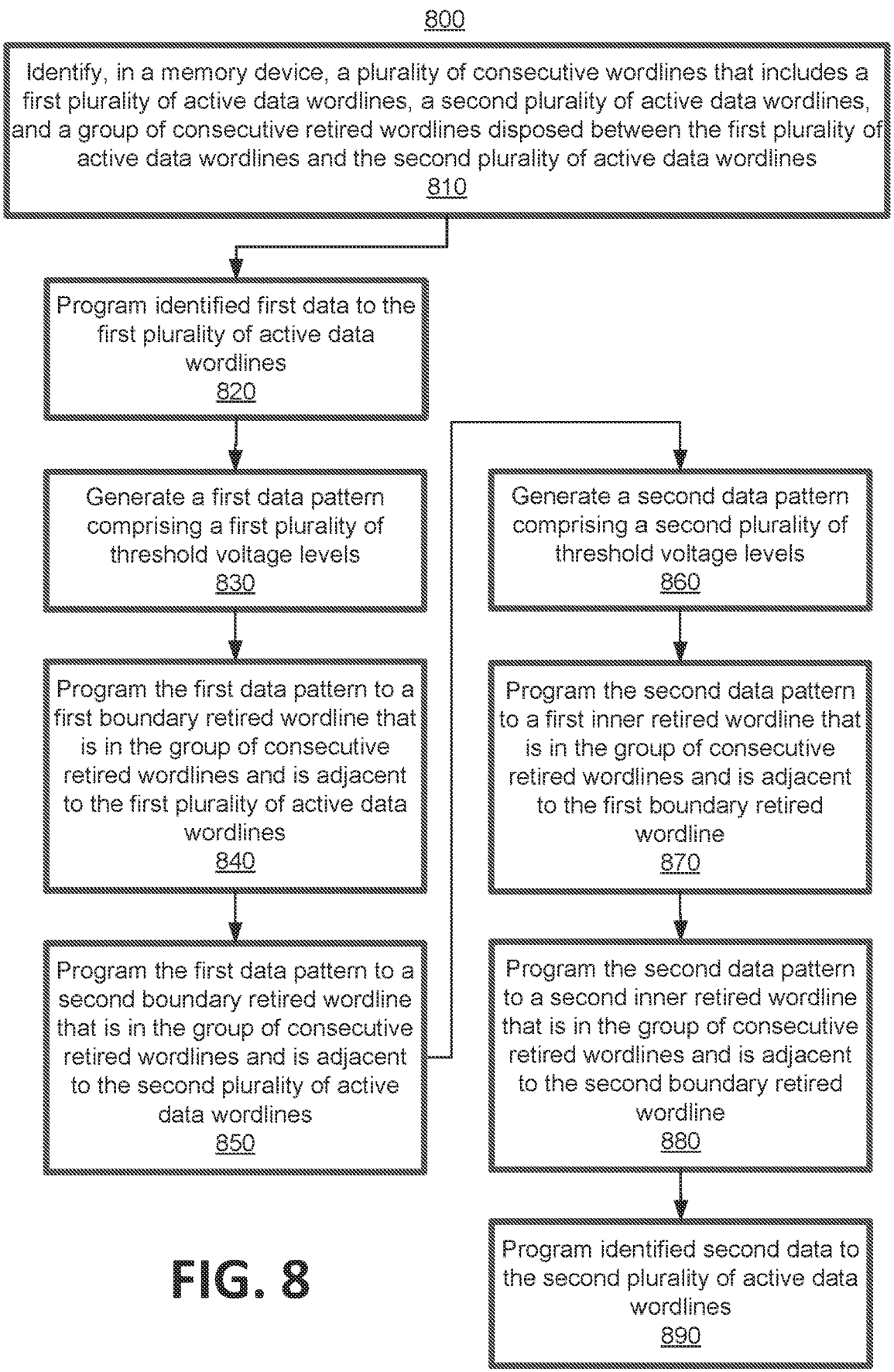
FIG. 8 is a flow diagram of an example method that programs a selected subset of retired wordlines that includes first and second retired boundary wordlines and first and second retired inner wordlines, in accordance with some embodiments.

FIG. 8 is a flow diagram of an example method 800 that programs a selected subset of retired wordlines that includes a retired boundary wordline and a retired inner wordline, in accordance with some embodiments. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the wordline programming component 113 and/or 137 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing logic identifies, in a memory device, a plurality of consecutive wordlines that includes a first plurality of active data wordlines, a second plurality of active data wordlines, and a group of consecutive retired wordlines disposed between the first plurality of active data wordlines and the second plurality of active data wordlines. For example, with respect to FIG. 4, the first plurality of active data wordlines includes wordlines WLa-WLc, the second plurality of active data wordlines includes WLk-WLm, and the group of consecutive wordlines includes wordlines WLd-WLj.

At operation 820, the processing logic programs identified first data to the first plurality of active data wordlines. The identified first data can be specified by a programming command or identified using any suitable information, e.g., a data structure that includes a memory address of the first data. The result of programming the first data to the active data wordlines WLa-WLc is shown in the cells of wordlines WLa-WLc of FIG. 4. For example, wordline WLa includes the cell values L0, L4, L0, L4.

At operation 830, the processing logic generates a first data pattern comprising a first plurality of threshold voltage levels. The first data pattern can be, for example, a random sequence of threshold voltage levels, such as the sequence L0, L4, L7, L4 shown in wordline WLd of FIG. 4.

At operation 840, the processing logic programs the first data pattern to a first boundary retired wordline that is in the group of consecutive retired wordlines and is adjacent to the first plurality of active data wordlines. For example, the result of programming the random sequence of threshold voltage levels to the four example cells of wordline WLd is shown in FIG. 4.

At operation 850, the processing logic programs the first data pattern to a second boundary retired wordline that is in the group of consecutive retired wordlines and is adjacent to the second plurality of active data wordlines. For example, the second boundary retired wordline can be wordline WLj, and the result of programming the random sequence of threshold voltage levels to the four example cells of wordline WLj, which have the values L0, L4, L0, L7, is shown in FIG. 4.

At operation 860, the processing logic generates a second data pattern comprising a second plurality of threshold voltage levels. The second data pattern can be, for example, a sequence of high threshold voltage levels (e.g., L6 or L7) or a sequence of highest threshold voltage levels (e.g., L7). In FIG. 4, the second data pattern is a sequence of L7 threshold voltage levels.

At operation 870, the processing logic programs the second data pattern to a first inner retired wordline that is in the group of consecutive retired wordlines and is adjacent to the first boundary retired wordline. For example, the first inner retired wordline can be wordline WLe of FIG. 4, and the result of programming the second data pattern to the first inner retired wordline is shown in the cells of WLe, which have the values L7, L7, L7, L7.

At operation 880, the processing logic programs the second data pattern to a second inner retired wordline that is in the group of consecutive retired wordlines and is adjacent to the second boundary retired wordline. For example, the second inner retired wordline can be wordline WLi of FIG. 4, and the result of programming the second data pattern to the second inner retired wordline is shown in the cells of WLi, which have the values L7, L7, L7, L7.

At operation 890, the processing logic programs identified second data to the second plurality of active data wordlines. The identified second data can be specified by a programming command or identified using any suitable information, e.g., a data structure that includes a memory address of the second data. The result of programming the second data to the second plurality of active data wordlines WLk-WLm is shown in the cells of wordlines WLa-WLc of FIG. 4. For example, wordline WLm includes the cell values L4, L7, L4, L7.

Figure 9:
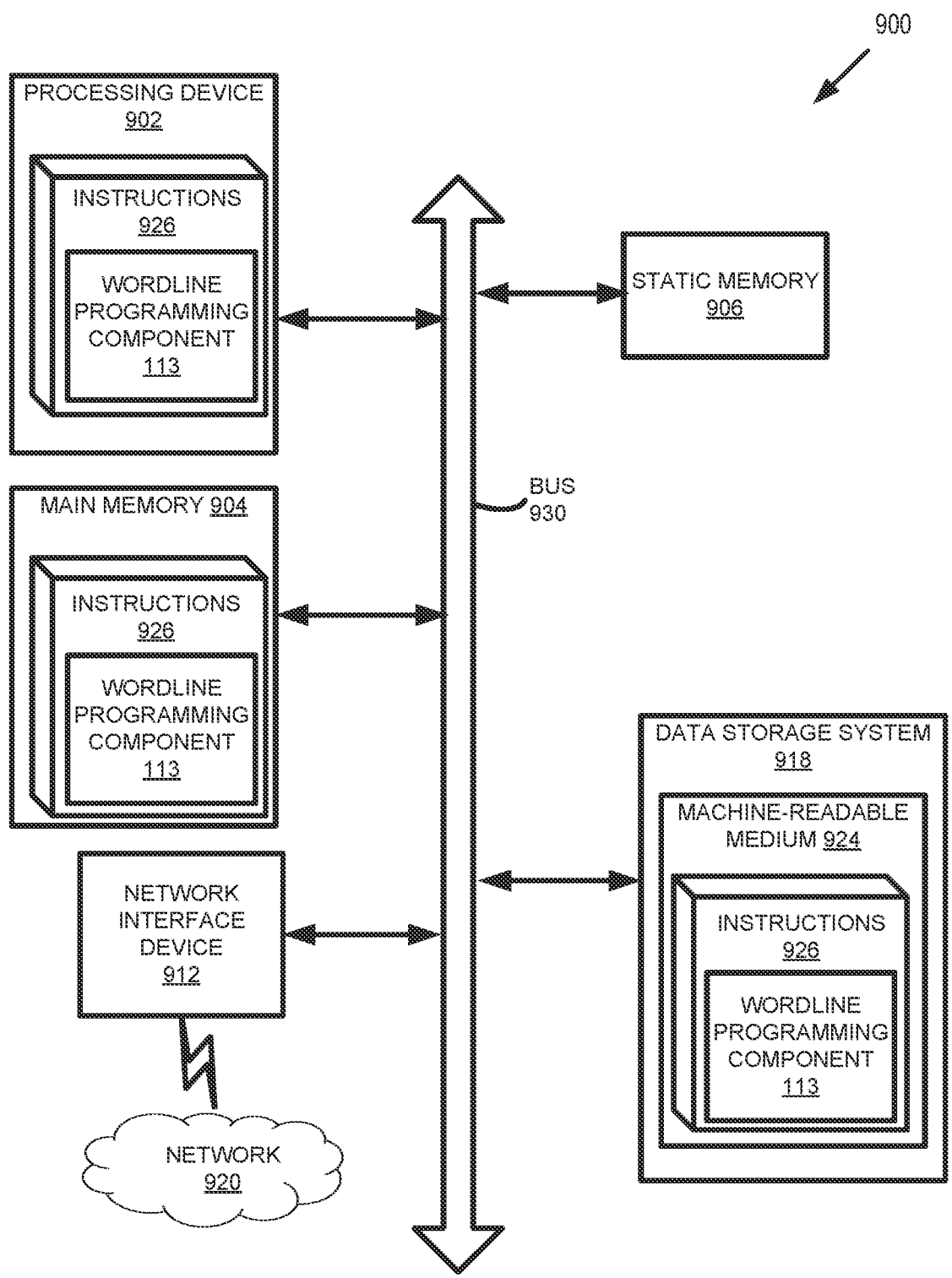
FIG. 9 is a block diagram of an example computer system in which implementations of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to a wordline programming component 113 and/or 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1A.

In one embodiment, the instructions 926 include instructions to implement functionality corresponding to a read voltage adjustment component (e.g., the wordline programming component 113 and/or 137 of FIG. 1A). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising: an array of memory cells organized into a plurality of wordlines; and a processing device, operatively coupled to the memory device, to perform processing operations comprising: receiving a program command, the program command specifying a memory unit of the memory device and further specifying data comprising first received data, wherein the plurality of wordlines includes one or more first active data wordlines and a group of consecutive retired wordlines; and programming the specified data to the memory unit, wherein programming the specified data comprises: programming the first received data to the one or more first active data wordlines, identifying a first retired boundary wordline that is in the group of consecutive retired wordlines and is adjacent to one of the first active data wordlines, generating a first data pattern comprising a first plurality of threshold voltage levels, programming the first data pattern to the first retired boundary wordline identifying a first retired inner wordline of the group of consecutive retired wordlines, wherein the first retired inner wordline is adjacent to the first retired boundary wordline, and the first retired inner wordline is separated from the one or more first active data wordlines by the first retired boundary wordline, generating a second data pattern comprising a second plurality of threshold voltage levels, wherein the second data pattern is different from the first data pattern, and programming the second data pattern to the first retired inner wordline, wherein programming the specified data to the memory unit does not program at least one of the group of consecutive retired wordlines.

2. The memory device of claim 1, wherein programming the first received data to the one or more first active data wordlines comprises causing the first received data to be programmed to a plurality of memory cells of the memory unit, wherein the plurality of memory cells corresponds to the one or more first active data wordlines.

3. The memory device of claim 1, wherein programming the first data pattern to the first retired boundary wordline comprises causing the first data pattern to be programmed to a plurality of memory cells of the memory unit, wherein the plurality of memory cells corresponds to the first retired boundary wordline that is adjacent to one of the first active data wordlines.

4. The memory device of claim 3, wherein the memory device further comprises a plurality of bitlines, each of the plurality of wordlines intersects one of the plurality of bitlines, and each of the first plurality of threshold voltage levels corresponds to a respective one of the plurality of bitlines.

5. The memory device of claim 4, wherein each of the first plurality of threshold voltage levels is programmed to a respective one of the plurality of memory cells that is located at an intersection between the first retired boundary wordline and the respective one of the plurality of bitlines.

6. The memory device of claim 1, wherein each of the first plurality of threshold voltage levels is determined based on a respective pseudo-random value.

7. The memory device of claim 1, wherein each of the first plurality of threshold voltage levels is a median threshold voltage level between a lowest threshold voltage level and a highest threshold voltage level of the memory device.

8. The memory device of claim 1, wherein each of the second plurality of threshold voltage levels is a highest threshold voltage level of the memory device, and each of the first plurality of threshold voltage levels is determined based on a respective pseudo-random value.

9. The memory device of claim 1, wherein the plurality of wordlines further includes one or more second active data wordlines, and wherein the one or more second active data wordlines are separated from the one or more first active data wordlines by the group of consecutive retired wordlines,
wherein the group of consecutive retired wordlines further includes a second retired boundary wordline that is adjacent to one of the second active data wordlines, and wherein programming the specified data to the memory unit further comprises:
programming the first data pattern to the second retired boundary wordline.

10. The memory device of claim 9, wherein the specified data further comprises second received data, and wherein programming the specified data to the memory unit further comprises programming the second received data to the one or more second active data wordlines.

11. The memory device of claim 9, wherein programming the specified data to the memory unit further comprises:
identifying a first retired inner wordline and a second retired inner wordline of the group of consecutive retired wordlines, wherein the first retired inner wordline is adjacent to the first retired boundary wordline, and the second retired inner wordline is adjacent to the second retired boundary wordline;
generating a second data pattern comprising a second plurality of threshold voltage levels; and
programming the second data pattern to the first retired inner wordline and to the second retired inner wordline.

12. The memory device of claim 11, wherein each of the second plurality of threshold voltage levels is a highest threshold voltage level of the memory device, and each of the first plurality of threshold voltage levels is determined based on a respective pseudo-random value.

13. The memory device of claim 1, wherein the program command further specifies a physical address that identifies the memory unit.

14. A method comprising: receiving a program command, the program command specifying a memory unit of a memory device and further specifying data comprising first received data and second received data, wherein the memory device includes a plurality of wordlines that includes one or more first active data wordlines and a group of consecutive retired wordlines, wherein the group of consecutive retired wordlines includes a first retired boundary wordline that is adjacent to one of the first active data wordlines, and further includes one or more second retired wordlines; generating a first data pattern comprising a first plurality of threshold voltage levels; programming the first data pattern to a first plurality of memory cells of the memory unit, wherein the first plurality of memory cells corresponds to the first retired boundary wordline, wherein programming the first data pattern to the first plurality of memory cells reduces a voltage difference between at least one cell of the one of the first active data wordlines and at least one cell of at least one of the one or more second retired wordlines, wherein programming the first data pattern does not program at least one of the group of consecutive retired wordlines; generating a second data pattern comprising a second plurality of threshold voltage levels, wherein the second data pattern is different from the first data pattern; programming the second data pattern to a second plurality of memory cells of the memory unit, wherein the second plurality of memory cells corresponds to a first retired inner wordline of the group consecutive retired wordlines, wherein the first retired inner wordline is adjacent to the first retired boundary wordline, and the first retired inner wordline is separated from the one or more first active data wordlines by the first retired boundary wordline; and causing the first received data to be programmed to a second plurality of memory cells of the memory unit, wherein the second plurality of memory cells corresponds to the one or more first active data wordlines.

15. The method of claim 14, wherein programming the first data pattern to the first plurality of memory cells reduces an amount of charge loss between the at least one cell of the one of the first active data wordlines and the at least one cell of at least one of the one or more second retired wordlines.

16. The method of claim 14, wherein programming the first data pattern to the first plurality of memory cells offsets a voltage reduction in the at least one cell of the one of the first active data wordlines caused by a negative pillar potential region associated with the at least one cell of at least one of the one or more second retired wordlines.

17. A non-transitory computer readable medium comprising instructions, which when executed by a processing device, cause the processing device to perform processing operations comprising: receiving a program command, the program command specifying a memory unit of a memory device and further specifying data comprising first received data, wherein the memory device comprises an array of memory cells organized into a plurality of wordlines, wherein the plurality of wordlines includes one or more first active data wordlines and a group of consecutive retired wordlines; and programming the specified data to the memory unit, wherein programming the specified data comprises: programming the first received data to the one or more first active data wordlines, identifying a first retired boundary wordline that is in the group of consecutive retired wordlines and is adjacent to one of the first active data wordlines, generating a first data pattern comprising a first plurality of threshold voltage levels, programming the first data pattern to the first retired boundary wordline, identifying a first retired inner wordline of the group of consecutive retired wordlines, wherein the first retired inner wordline is adjacent to the first retired boundary wordline, and the first retired inner wordline is separated from the one or more first active data wordlines by the first retired boundary wordline, generating a second data pattern comprising a second plurality of threshold voltage levels, wherein the second data pattern is different from the first data pattern, and programming the second data pattern to the first retired inner wordline, wherein programming the specified data to the memory unit does not program at least one of the group of consecutive retired wordlines.

* * * * *